(12) United States Patent
Khare et al.

(10) Patent No.: US 11,867,744 B2
(45) Date of Patent: Jan. 9, 2024

(54) TECHNIQUES FOR ISOLATING INTERFACES WHILE TESTING SEMICONDUCTOR DEVICES

(71) Applicant: NVIDIA CORPORATION, Santa Clara, CA (US)

(72) Inventors: Animesh Khare, Bangladore (IN); Ashish Kumar, Patna (IN); Shantanu Sarangi, Saratoga, CA (US); Rahul Garg, Jind (IN); Sailendra Chadalavada, Saratoga, CA (US)

(73) Assignee: NVIDIA Corporation, Santa Clara, CA (US)

( * ) Notice: Subject to any disclaimer, the term of this patent is extended or adjusted under 35 U.S.C. 154(b) by 322 days.

(21) Appl. No.: 17/075,629

(22) Filed: Oct. 20, 2020

(65) Prior Publication Data

US 2022/0120804 A1 Apr. 21, 2022

(51) Int. Cl.
*G01R 31/26* (2020.01)
*G01R 31/317* (2006.01)
*G01R 31/3183* (2006.01)
*G01R 31/3185* (2006.01)
*G06F 13/42* (2006.01)

(52) U.S. Cl.
CPC ..... *G01R 31/2601* (2013.01); *G01R 31/2639* (2013.01); *G01R 31/31725* (2013.01); *G01R 31/318328* (2013.01); *G01R 31/318536* (2013.01); *G06F 13/4221* (2013.01); *G06F 2213/0026* (2013.01)

(58) Field of Classification Search
None
See application file for complete search history.

(56) References Cited

U.S. PATENT DOCUMENTS

| | | | |
|---|---|---|---|
| 10,922,203 B1 * | 2/2021 | Alben | G06F 1/04 |
| 11,487,341 B2 * | 11/2022 | Naik | G06F 1/324 |
| 2017/0212549 A1 * | 7/2017 | Kim | G06F 1/06 |
| 2017/0220495 A1 * | 8/2017 | Jeon | G06F 13/1689 |
| 2018/0276094 A1 * | 9/2018 | Pappu | G06F 11/2221 |
| 2022/0121542 A1 * | 4/2022 | Khare | G06F 13/28 |
| 2022/0138387 A1 * | 5/2022 | Narayanun | G06F 30/394 |
| | | | 716/103 |

FOREIGN PATENT DOCUMENTS

EP 1286248 B1 * 11/2005 ........... G06F 1/3228

* cited by examiner

*Primary Examiner* — Jermele M Hollington
(74) *Attorney, Agent, or Firm* — Artegis Law Group, LLP

(57) ABSTRACT

Techniques for isolating interfaces while testing a semiconductor device include a semiconductor device having a link interface that couples the semiconductor device to a high-speed data transfer link, a clock control unit that transmits one or more clock signals to the link interface; and a protection module. The protection module asserts a clock stop request to the clock control unit and, in response to receiving a clock stop acknowledgement from the clock control unit, asserts a clamp enable to cause the link interface to be isolated from portions of the semiconductor device. After waiting for a first predetermined period of time to expire, the protection module de-asserts the clock stop request.

20 Claims, 7 Drawing Sheets

TECHNIQUES FOR ISOLATING INTERFACES WHILE TESTING SEMICONDUCTOR DEVICES

FIELD

The various embodiments relate generally to semiconductor devices and semiconductor device production and, more particularly, to techniques for testing semiconductor devices.

BACKGROUND

In order to ensure that semiconductor devices, such as application-specific integrated circuits (ASICs), systems on a chip (SOCs), graphics processing units (CPUs), central processing units (CPUs), function properly, these semiconductor devices often undergo rigorous testing. For example, after a semiconductor device is manufactured, the semiconductor device is typically subjected to numerous manufacturing, functional, and/or system-level tests. As another example, once the semiconductor device is incorporated into a system, the semiconductor device and the system are subjected to numerous in-system or field tests. In each of these different types of tests, a test access mechanism of the semiconductor device is used to transfer test data into the semiconductor device, where, in most situations, known test values are provided as inputs to the various gates and components on the semiconductor device. Once the test data is transferred to the gates and components of the semiconductor device, the device performs regular operations using the test data to generate test results. The test access mechanism is then used to transfer the test results out of the semiconductor device, and the test results are compared to a set of expected results to determine whether the semiconductor device passed or failed the test. The testing process is repeated until all of the tests for the semiconductor device are completed.

Existing techniques for system-level testing of semiconductor devices typically implement specialized automated test equipment (ATE) that is connected to one or more dedicated test or multi-purpose input/output circuits on the semiconductor device. For a given test, the ATE transfers the relevant test data into the semiconductor device via the input/output circuits, and the data is distributed to the gates and components using a test bus. As noted above, the semiconductor device performs operations using the test data to generate the test results, and then the ATE transfers the test results out of the semiconductor device via the test bus and the input/output circuits.

The above approach for system-level testing of semiconductor devices has multiple drawbacks. First, each new generation of semiconductor device is roughly thirty percent more complex than the immediately previous generation of semiconductor device because of larger and more complex functionality implemented by the new generation. The added complexity increases the amount of test data and test results for each test as well increases the number of tests that are performed. Further, because of the functionality added with each generation, dedicated test input/output pins or pads may not be available on semiconductor devices and fewer multi-purpose input/output pins or pads may be available for use in the test mode. As a result, the ATE is required to transfer more test data and test results using fewer input/output pins or pads, which increases the amount of testing time for the semiconductor device. As a general matter, longer testing times reduce the number of semiconductor devices that can be manufactured and tested and, therefore, are undesirable.

Second, when using an ATE to test a semiconductor device, the semiconductor device is mounted to a specially designed circuit board used for testing. As a result, an ATE cannot be used to test a semiconductor device after the semiconductor device is installed in a final system. Because in-system tests are now mandated under ISO26262 for semiconductor devices used in automotive systems, non-ATE-based testing mechanisms are needed.

Third, testing connections are typically not available after the semiconductor device is installed in the final system so an ATE cannot be connected to the semiconductor device after the ATE is installed in the final system. When an ATE performs a manufacturing test of the semiconductor device, the semiconductor device is not operating under the same power, temperature, and/or environmental conditions present during actual operation of the semiconductor device. As a result, tests performed by the ATE often fail to correlate with functional tests due to changes in power, temperature, and/or environmental conditions found during actual operation of the semiconductor device.

As the foregoing illustrates, what is needed in the art are improved techniques for testing semiconductor devices.

SUMMARY

One embodiment of the present invention sets forth a technique for isolating a link interface while testing a semiconductor device. The technique includes a semiconductor device having a link interface that couples the semiconductor device to a high-speed data transfer link, a clock control unit that transmits one or more clock signals to the link interface; and a protection module. The protection module asserts a clock stop request to the clock control unit and, in response to receiving a clock stop acknowledgement from the clock control unit, asserts a clamp enable to cause the link interface to be isolated from portions of the semiconductor device. After waiting for a first predetermined period of time to expire, the protection module de-asserts the clock stop request.

One technical advantage of the disclosed techniques relative to the prior art is that, with the disclosed techniques, a hardware-based protection module is implemented to safely isolate a link interface while the link interface is being used during semiconductor device testing. In particular, the protection module is able to control both a clock control unit of the semiconductor device and a clamp located in the link interface during testing, which enables the protection module to stop clock signals from being transmitted to the link interface while the clamp isolates the link interface during a test. Among other things, stopping clock signals from being sent to the link interface during a given test ensures that the link interface does not receive spurious clock events or different numbers of clock events while the clamp isolates the link interface, which, in turn, ensures that the link interface is not corrupted during the test or during the isolating. Another technical advantage is that, with the disclosed techniques, the link interface is isolated faster relative to prior art approaches, thereby reducing overall semiconductor device test time. These technical advantages provide one or more technological improvements over prior art approaches.

BRIEF DESCRIPTION OF THE DRAWINGS

So that the manner in which the above recited features of the various embodiments can be understood in detail, a more particular description of the various embodiments, briefly summarized above, may be had by reference to embodiments, some of which are illustrated in the appended drawings. It is to be noted, however, that the appended drawings illustrate only typical embodiments of the inventive concepts and are therefore not to be considered limiting of its scope, for the invention may admit to other equally effective embodiments.

DETAILED DESCRIPTION

Figure 1:
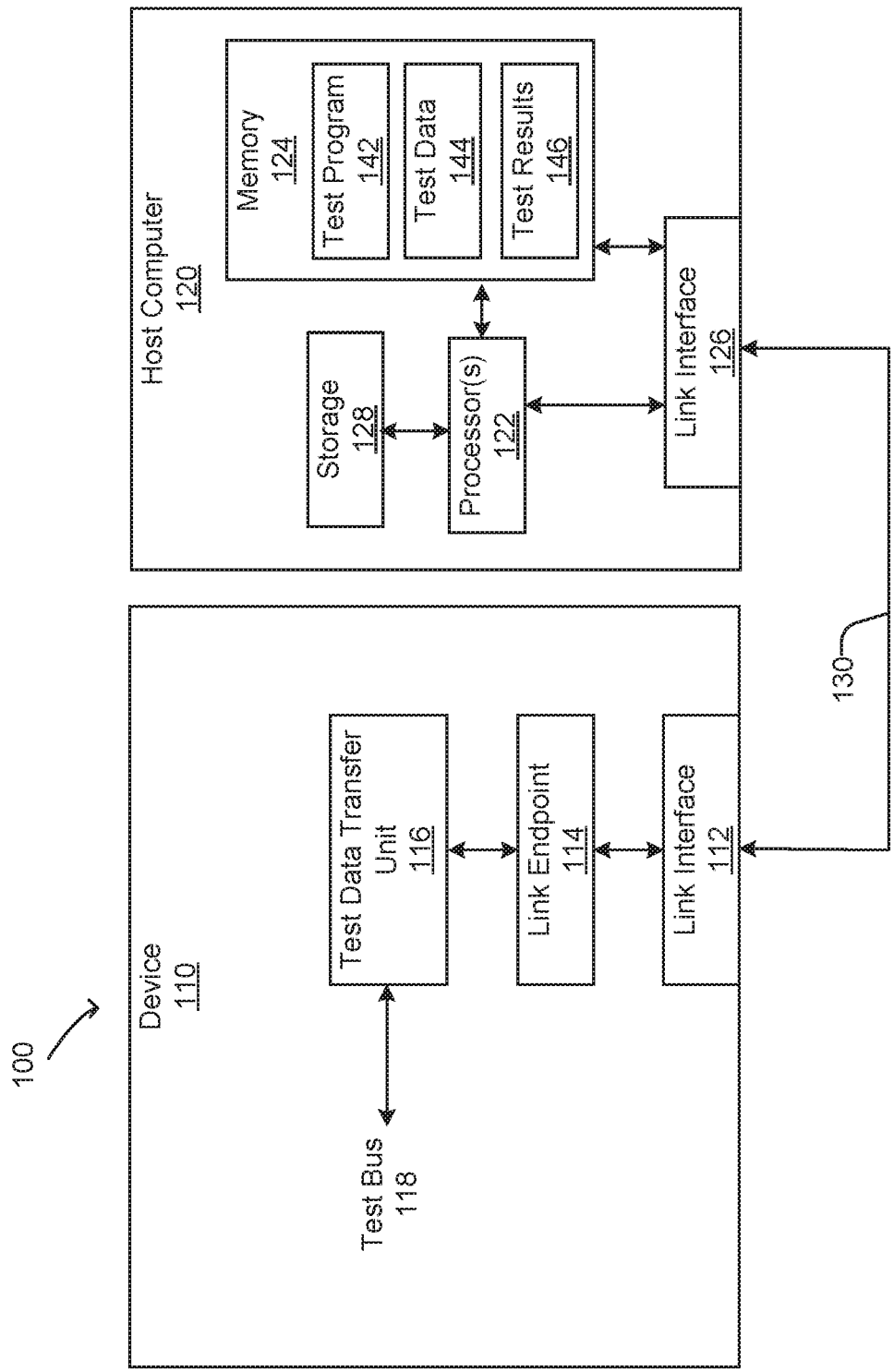
FIG. 1 illustrates an exemplary test environment configured to implement one or more aspects of the various embodiments.

In the following description, numerous specific details are set forth to provide a more thorough understanding of at least one embodiment. However, it will be apparent to one skilled in the art that the inventive concepts may be practiced without one or more of these specific details.

General Overview

Computer chips and devices, such as application-specific integrated circuits (ASICs) systems on a chip (SoCs), graphics processing units (GPUs) and central processing units (CPUs), are typically tested extensively to ensure that the computer chips will operate properly when the computer chips are used in a final system, such as a computing system that may be included in an autonomous vehicle. A test of a computer chip typically involves sending specific test data to the computer chip that is designed to test one or more features or capabilities of the computer chip. The one or more features or capabilities are then tested, and results of the test are then retrieved from the computer chip and compared to expected results associated with the test. If the results of the test are the same as the expected results, then the test is passed. If the results of the test are different from the expected results, then the test is failed. The testing process is then repeated until all the tests associated with the computer chip have been performed.

Because computer chips are very complex, the amount of test data that is sent to the computer chip and the amount of test results that are retrieved from the computer chip are quite large. Typically, most of the time spent testing the computer chip is spent sending the test data and retrieving the test results. Thus, the amount of time spent testing a computer chip can be significantly reduced by sending the test data and retrieving the test results using a high-speed data transfer connection that is already present on many computer chips.

To perform a test on a computer chip, a computer is connected to the computer chip using the high-speed data transfer connection. The computer stores test data in the memory of the computer. The computer then sends instructions to a high-speed test data transfer unit on the computer chip being tested. The instructions tell the high-speed test data transfer unit where to find the test data in the memory, how much test data there is, and where to store the test results in the memory. The computer then tells the high-speed test data transfer unit to begin the test. After the computer is told that the test is complete, the computer reads the test results from the memory and provides the test results to a testing program that will compare the test results to the expected results associated with the test.

After receiving the instruction to begin the test, the high-speed test data transfer unit reads the test data directly from the memory of the computer and copies the test data to the computer chip using the high-speed data transfer connection. As the high-speed test data transfer unit receives the copy of the test data the high-speed test data transfer unit distributes the test data to the components on the computer chip that are being tested. Once the high-speed test data transfer unit receives and distributes all the test data, the high-speed transfer unit starts the test on the computer chip, which causes the components on the computer chip to perform ore or more operations using the test data. After at least a portion of the test completes, the high-speed transfer unit retrieves the test results from the components on the computer chip and copies the test results to the location in the memory provided in the instructions received from the computer using the high-speed data transfer connection. After the test results are copied to the memory of the computer, the high-speed test data transfer unit tells the computer that the test is finished. Importantly, once the high-speed test data transfer unit has received the instructions from the computer, the high-speed test data transfer unit is able to get the test data, perform the test, and store the test results automatically without further supervision or involvement by the computer. Because the computer does not need to supervise the high-speed test data transfer unit, the computer can be used for other things while testing of the computer chip is taking place.

As an example, a test to determine whether a computer chip has manufacturing defects can be implemented using this testing approach. The test data stored in the memory by the computer could include configuration data and input data for components of the computer chip. The high-speed test data transfer unit copies the test data and uses the test data to configure the appropriate components on the computer chip and provide the input data for those components. The high-speed test data transfer unit then runs the test and copies the results of the test to the memory of the computer. Once the computer is told that the test is complete, the computer can send the results of the test to the testing program, which compares the results to the expected results to determine whether a manufacturing defect has been detected.

In order for the high-speed test data transfer unit to use the high-speed data transfer connection, steps are taken to ensure that the high-speed data transfer connection is not corrupted by the test. To prevent the test from corrupting the high-speed data transfer connection, the high-speed data transfer connection is isolated from the rest of the computer chip. This isolation includes disconnecting inputs of the high-speed data transfer connection from the rest of the chip and keeping those inputs at consistent values during the isolation. After the test is complete, the isolation is removed and the high-speed data transfer connection is reconnected to the rest of the computer chip.

To prevent the high speed data transfer connection from being corrupted during the course of a test, the computer chip is equipped with a protection module that isolates the high-speed data transfer connection from the rest of the computer chip before the high-speed data transfer connection is used by the high-speed data transfer unit. The protection module first stops the interface circuits of the device used to communicate with the high-speed data transfer connection by having a clock control unit stop transmitting clock signals that allow the interface circuits to operate. Once the protection module knows the clock control unit has stopped transmitting the clock signals, the protection module the current values of inputs to the interface circuits are recorded, the inputs are disconnected from the rest of the computer chip, and the inputs are held at the recorded values. After waiting long enough to guarantee that the high-speed data transfer connection is isolated, the protection module has the clock control unit restart transmitting the clock signals to the interface circuits so that the interface circuits can be used by the high-speed test data transfer unit to transfer the test data and test results.

After the high-speed test data transfer unit is done using the high-speed data transfer connection, the protection module reverses the steps used to isolate the condition of the high-speed data transfer connection. To reconnect the high-speed data transfer connection to the rest of the computer chip, the protection module again stops the interface circuits, waits until the interface circuits are stopped, and then reconnects the inputs of the interface circuits to the rest of the computer chip. Alternatively, the interface circuits can be reconnected to the rest of the computer chip by causing the computer chip to be reset.

Test Environment Architecture

FIG. 1 illustrates an exemplary test environment 100 configured to implement one or more aspects of the various embodiments. As shown in FIG. 1, test environment 100 includes a device 110 to be tested coupled to a host computer 120 using a high-speed data transfer link 130. In some embodiments, high-speed data transfer link 130 may be a peripheral component interface express (PCIe) link. Device 110 may be a semiconductor device, an ASIC, an SoC, a computing device, and/or the like. Device 110 may also include a plurality of components (not shown), which implement the functionality of device 110 and are to be tested. In some embodiments, these components may include logic gates, clocks, buses, and/or the like.

Device 110 is coupled to high-speed data transfer link 130 via a link interface 112. Link interface 112 couples one or more pins or pads on device 110 to which high-speed data transfer link 130 is connected to a link endpoint 114. In some embodiments, link interface 112 may also include signal conditioning circuitry, drivers, and/or the like.

In some embodiments, each of the components on device 110 that transmits and/or receives data via high-speed data transfer link 130 is associated with a corresponding link endpoint. As shown in FIG. 1, link endpoint 114 is the link endpoint for a test data transfer unit 116. In some embodiments, link endpoint 114 may be a PCIe endpoint. Link endpoint 114 is an interface between high-speed data transfer link 130 and test data transfer unit 116 that allows test data transfer unit 116 to receive commands and/or configuration information from other devices on high-speed data transfer link 130 (e.g., host computer 120), transmit status information to other devices on high-speed data transfer link 130, transmit and/or receive data on high-speed data transfer link 130, and/or the like.

Test data transfer unit 116 is a high-speed test data transfer unit that handles the testing of device 110. In some embodiments, test data transfer unit 116 receives commands and configuration information from host computer 120 regarding a test to be performed on device 110. The configuration information associated with the test includes an address, in memory of host computer 120, of test data associated with the test. In some embodiments, the configuration information may further include an amount of test data associated with the test, an address in the memory of host computer 120 where test results from the test are to be saved, and/or an identifier associated with the test. In some embodiments, test data transfer unit 116 may not receive the amount of test data associated with the test, the address where the test results are to be saved, and/or the identifier associated with the test directly from host computer 120, but may instead read them from a header or other portion of the test data after test data transfer unit 116 begins to read the test data from the memory of host computer 120. In some embodiments, the configuration information may include clock configurations associated with configuring a speed and/or a phase of one or more of the clocks and/or clock control units on device 110. In such embodiments, test data transfer unit 116 uses the clock configuration to configure the one or more clocks and/or clock units. Once test data transfer unit 116 has received the configuration information associated with the test, test data transfer unit 116 receives a test start command from host computer 120 to begin the test. In some embodiments, the test start command may set a direct memory access (DMA) enable bit of test data transfer unit 116. In some embodiments, the commands may also include an instruction to reset device 110 before any of the configuration information and/or the test start command are received from host computer 120.

Once test data transfer unit 116 receives the command to begin the test of device 110, test data transfer unit 116 reads the test data from the memory of host computer 120 using the address of the test data provided by host computer 120. In some embodiments, test data transfer unit 116 reads the data directly from the memory of host computer 120 via high-speed data transfer link 130 using DMA techniques. In some embodiments, test data transfer unit 116 includes a DMA controller or is a DMA controller customized for performing tests of device 110. As test data transfer unit 116 reads the test data from the memory of host computer 120, test data transfer unit 116 transmits the test data to test bus 118 so that the test data is distributed to the components of device 110. Once all of the test data associated with the test is read and transmitted to test bus 118, test data transfer unit 116 begins the test and waits a suitable period of time for the test to complete on device 110. Once the test is complete, test data transfer unit 116 retrieves the test results from test bus 118 and saves the test results found on test bus 118 to the address in the memory of host computer 120 provided in the configuration information using DMA techniques. After the test results are saved to the memory of host computer 120, test data transfer unit transmits a notification to host computer 120 that the test is complete. In some embodiments, the notification may include an identifier associated with the test just completed.

By using high-speed data transfer link 130 to read the test data from the memory of host computer 120 and to save the test results to the memory of host computer 120 using DMA techniques, test data transfer unit 116 is able to significantly reduce the amount of time spent transferring test data and test results and thus significantly reduce the amount of time to perform the test. For example, when high-speed data transfer link 130 is a PCIe link with a 16 lane Gen 3 configuration, the test data and test results may be transferred at a rate of 16 GBytes per second, which is two orders of magnitude faster than using an ATE to transmit test data to test bus 118 and/or receive test results from test bus 118 using dedicated and/or multi-purpose pins or pads of device 110, such as pins or pads of a Joint Test Action Group (JTAG) test interface. For example, when ATE uses six pins or pads clocked at 200 MHz, the test data and/or test results are limited to 150 Mbytes per second (=6×200/8). Thus, using test data transfer unit 116 as described above significantly reduces the time spent running the test by two orders of magnitude. In addition to the faster test data and test results data transfer speeds than testing solutions using an ATE, test data transfer unit 116 performs tests of device 110 without using an ATE and to perform tests, such as in-system tests that cannot be performed using an ATE.

In some embodiments, test data transfer unit 116 may also be configured to perform multiple tests based on the initial configuration information provided by host computer 120. In such embodiments, the header or another portion of the test data associated with a first test may include configuration information associated with a second test to be performed after the first test is complete. The configuration information associated with the second test may include an address in the memory of host computer 120 where the test data associated with the second test is read from, an amount of test data associated with the second test, an address in the memory of host computer 120 where the test results from the second test are to be saved, and/or an identifier associated with the second test. Thus, once the first test is complete and the test results associated with the first test are saved to the memory of host computer 120, test data transfer unit 116 can begin the second test. Additional tests may be performed as long as the test data associated with one test includes the configuration information associated with a next test. In some embodiments, the test data associated with a last test may include an indication that there are no further tests. In some embodiments, test data transfer unit 116 may transmit a notification to host computer 120 after the test results associated with each test is saved to the memory of host computer 120 is completed and/or once all the test data associated with all the tests are saved to the memory of host computer 120. In some embodiments, the notification may include the identifier associated with the respective test.

In some embodiments, host computer 120 may be a desktop computer, a laptop computer, a smart phone, PDA, tablet computer, or any other type of computing device configured to receive input, process data, and optionally display images, and is suitable for practicing one or more embodiments. Host computer 120 is configured to run various programs and may use device 110 to perform various tasks. It is noted that host computer 120 as described herein is illustrative and that any other technically feasible configurations fall within the scope of the present disclosure.

As further shown in FIG. 1, host computer 120 includes one or more processors 122, memory 124, a link interface 126, and storage 128. Each of the one or more processors 122, memory 124, link interface 126, and/or storage 128 may be coupled together using one or more interconnects or buses, such as indicated by the various arrows showing connections between the one or more processors 122, memory 124, link interface 126, and/or storage 128. Each of the one or more processors 122 may be consistent with any suitable type processor including, without limitation, a CPU, a GPU, an ASIC, a FPGA, an AI accelerator, a microprocessor, a multi-core processor, a DSP, and/or the like. In some embodiments, the one or more processors 122 may include a combination of processors such as a CPU configured to operate in conjunction with a GPU. In general, each of the one or more processors 122 may be any technically feasible hardware unit capable of processing data and/or executing software applications. Further, in the context of this disclosure, the computing elements shown in host computer 120 may correspond to a physical computing system (e.g., a system in a data center or in an autonomous vehicle) or may be a virtual computing instance executing within a computing cloud or virtual machine.

Host computer 120 is coupled to high-speed data transfer link 130 via link interface 126. Link interface 126 couples one or more pins or pads on host computer 120 to which high-speed data transfer link 130 is connected to the one or more processors 122 and memory 124. In some embodiments, link interface 126 may also function as a primary controller for high-speed data transfer link 130. In some embodiments where high-speed data transfer link 130 is a PCIe link, link interface 126 may be a root complex for the PCIe link.

In some embodiments, storage 128 includes non-volatile storage for applications and data, and may include fixed or removable disk drives, flash memory devices, and CD-ROM, DVD-ROM, Blu-Ray, HD-DVD, or other magnetic, optical, or solid state storage devices. In some embodiments, software programs to be executed by the one or more processors 122 may be stored in storage 128 and loaded into memory 124 when executed. In some embodiments, storage 128 may also include test data and/or expected test results associated with one or more tests to be performed on device 110. And although not expressly shown, one or more portions of storage 128 may be located separated from host computer 120.

In some embodiments, memory 124 includes a random access memory (RAM) module, a flash memory unit, or any other type of memory unit or combination thereof. The one or more processors 122 are configured to read data from and write data to memory 124. Memory 124 may further include various software programs that can be executed by the one or more processors 122 and data associated with the software programs.

As shown in FIG. 1, memory 124 is storing a test program 142, test data 144, and test results 146. In operation, test program 142 coordinates the testing of device 110. To coordinate a test of device 110, test program 142 first allocates a first block of continuous data in memory 124 where test data 144 is to be stored. Once the block of memory for test data 144 is allocated, test program 142 reads the test data associated with the test (e.g., from storage 128) and stores the test data associated with the test in memory 124 as test data 144. Test program 142 then allocates a second block of contiguous data in memory 124 where test results 146 are to be stored. In some embodiments, test program 142 may further transmit one or more commands to an input/output memory management unit (IOMMU) (not shown) indicating that the blocks of memory allocated for test data 144 and/or test results 146 should be protected from paging and/or other actions that may alter the blocks of memory 124 while the test is being performed and to allow the blocks of memory to be used during DMA transfers.

Once the memory is allocated and the test data is stored as test data 144 in memory 124, test program 142 transmits commands and configuration information to test data transfer unit 116 regarding the test. In some embodiments, test program 142 transmits the commands and/or the configuration information to test data transfer unit 116 using high-speed data transfer link 130. In such embodiments, in order to use high-speed data transfer link 130, test program 142 may perform one or more discovery operations on high-speed data transfer link 130 using link interface 126 in order to identify and begin communication with link endpoint 114. As discussed above, the configuration information includes an address (e.g., a physical address) of the block of memory 124 where test data 144 is located, an amount of data in test data 144, an address (e.g., a physical address) of the block of memory 124 where test results 146 is located, and/or an identifier associated with the test. As a minimum, test program 142 transmits the address of the block of memory 124 where test data 144 is located to test data transfer unit 116. However, the amount of data in test data 144, the address of the block of memory 124 where test results 146 is located, and/or the identifier associated with the test may be either transmitted directly to test data transfer unit 116 or stored in a header or other portion of test data 144. In some embodiments, test program 142 may transmit clock configurations to test data transfer unit 116. In some embodiments, test program 142 may transmit a command to reset device 110 before transmitting the confirmation information or other commands associated with the test.

After the test data is stored to memory 124 as test data 144 and the configuration information associated with the test (e.g., at least the address of the block of memory 124 where test data 144 is stored), test program transmits a test start command to test data transfer unit 116. Once the test start command is transmitted, test program 142 waits for test data transfer unit 116 to indicate that the test is completed, and the test results are saved to the block of memory 124 where test results 146 is located. By turning over the testing to test data transfer unit 116, host computer 120 is able to perform other tasks while the test is being performed.

Once the test is complete and the test results are stored in the block of memory where test results 146 is located, test program 142 receives the notification that the test is complete from test data transfer unit 116, such as via an interrupt, a callback, and/or the like. In some embodiments, test program 142 may know which test is complete based on an identifier associated with the test included in the notification. Upon receiving the notification, test program 142 may store test results 146 in storage 128 and/or pass test results 146 to another testing program. Once test results 146 is saved and/or passed on, test program 142 may deallocate the blocks of memory for test data 144 and/or test results 146 and/or reuse those blocks for additional tests.

In some embodiments, test program 142 may also be used to have test data transfer unit 116 perform multiple tests. In such embodiments, test program 142 may allocate blocks of memory 124 for the test data and the test results for each test. Test program 142 may then include the configuration information associated with a next test in the test data test program 142 stores to the corresponding block of memory 124 of a previous test so that as test data transfer unit 116 reads the test data associated with the previous test, test data transfer unit 116 also receives the configuration information associated with the next test.

As discussed above and further emphasized here, FIG. 1 is merely an example which should not unduly limit the scope of the claims. Although not expressly shown in FIG. 1, test environment 100 may further include automated test equipment for performing one or more tests separate from the tests using test data transfer unit 116. In some embodiments, test program 142 may use other connections (not shown) between host computer 120 and device 110 to transmit the commands to test data transfer unit 116, to transmit the configuration information to test data transfer unit 116, and/or the receive the notification from test data transfer unit 116 that a test or tests are complete.

In some embodiments, test program 142 may allocate the blocks of memory for test data 144 and/or test results 146 using multiple sub-blocks that are individually contiguous. In such embodiments, the sub-blocks may be organized in a linked-list fashion so that test data transfer unit 116 reads each sub-block one at a time and uses an address stored in the header or other portion of the sub-block to learn where the next sub-block is located until a last sub-block indicates that there are no further sub-blocks. Use of this linked-list arrangement allows test data 144 and/or test results 146 to be stored in non-contiguous regions of memory 124.

In order for test data transfer unit 116 to use link interface 112 and high-speed data transfer link 130 to transfer test data from memory 124 and to transfer test results to memory 124 using DMA, link interface 112 is isolated from the portions of device 110 being tested to that the testing of those portions does not corrupt link interface 112.

One way to isolate link interface 112 during testing is to use the test access mechanisms of the IEEE1500 standard to send commands to link interface 112 to isolate link interface 112. However, the IEEE1500 test access mechanisms are typically accessed using a slow serial interface, which increases overall testing time. Further, this serial interface is not available during field testing of device 110.

Additionally, the IEEE1500 test access mechanisms are typically controlled using an ATE. But such an approach would defeat the underlying purposes of performing tests without an ATE in the first place. Further, when an ATE is used to perform system-level tests, the required clock control firmware may not be present on device 110, which would prevent the ATE from being able to control the clocks to link interface 112.

As the foregoing makes clear, implementing a hardware-based protection module on device 110 to isolate link interface 112 and to manage the clocks to link interface 112 during testing would be advantageous.

Techniques for Isolating Interfaces during High-Speed Test Data Transfer

Figure 2:
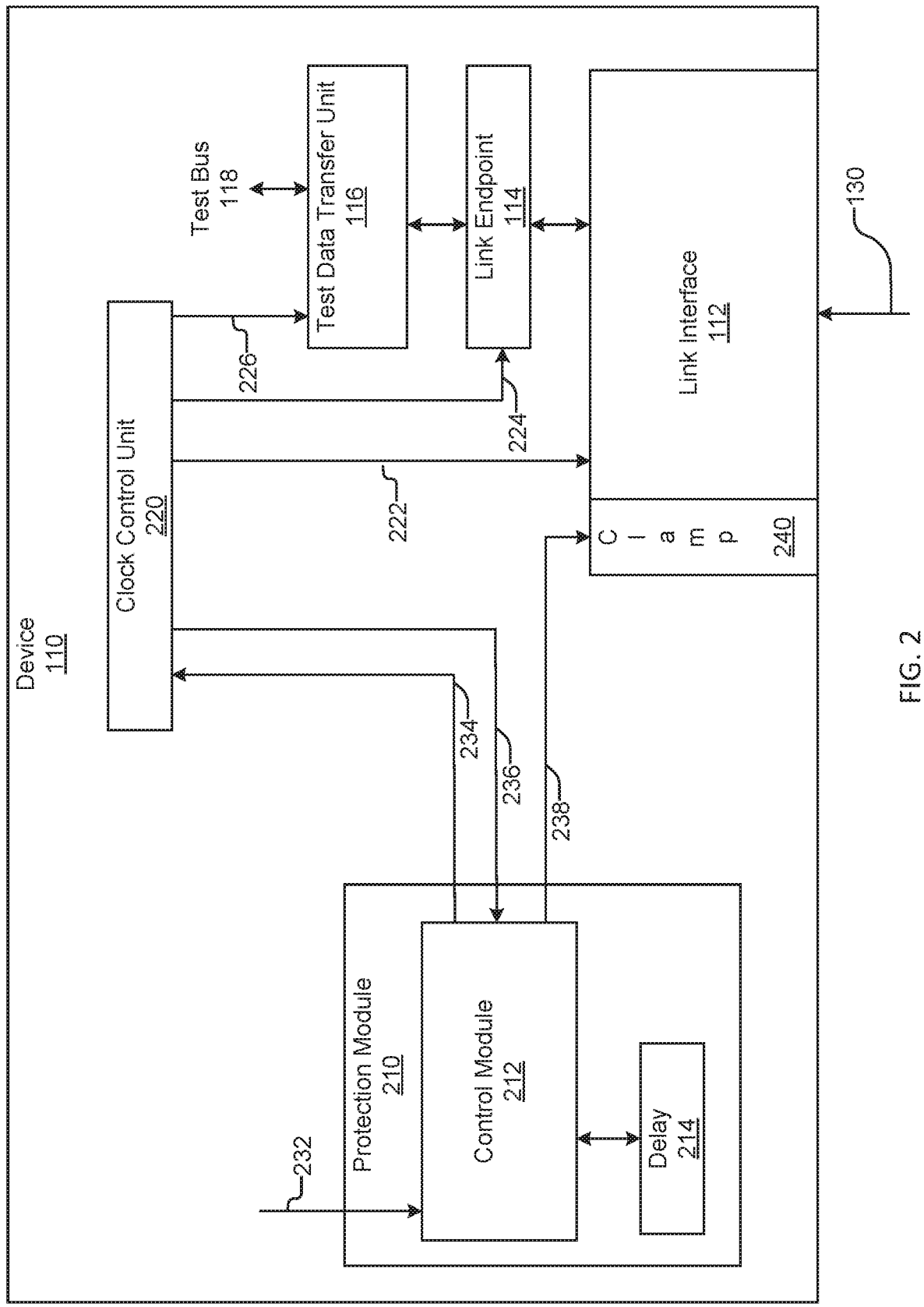
FIG. 2 is a more detailed illustration of the device of FIG. 1, according to various embodiments.

FIG. 2 is a more detailed illustration of the device of FIG. 1, according to various embodiments. In addition to link interface 112, link endpoint 114, test data transfer unit 116, and test bus 118 shown in FIG. 1, device 110 further includes a protection module 210 and a clock control unit 220. Although protection module 210 is shown separate from test data transfer unit 216, in some embodiments, protection module 210 may alternatively be part of test data transfer unit 216.

Clock control unit 220 generates a plurality of clocks signals that are distributed to various portions of device 110 As shown in FIG. 2, clock control unit 220 is generating a clock signal 222 that is transmitted to link interface 112, a clock signal 224 that is provided link endpoint 114, and a clock signal 226 that is transmitted to test data transfer unit 116. Although not shown, clock control unit 220 may generate other clock signals that are distributed to other gates, components, and/or the like of device 110, that are not shown in FIG. 2.

Figure 3:
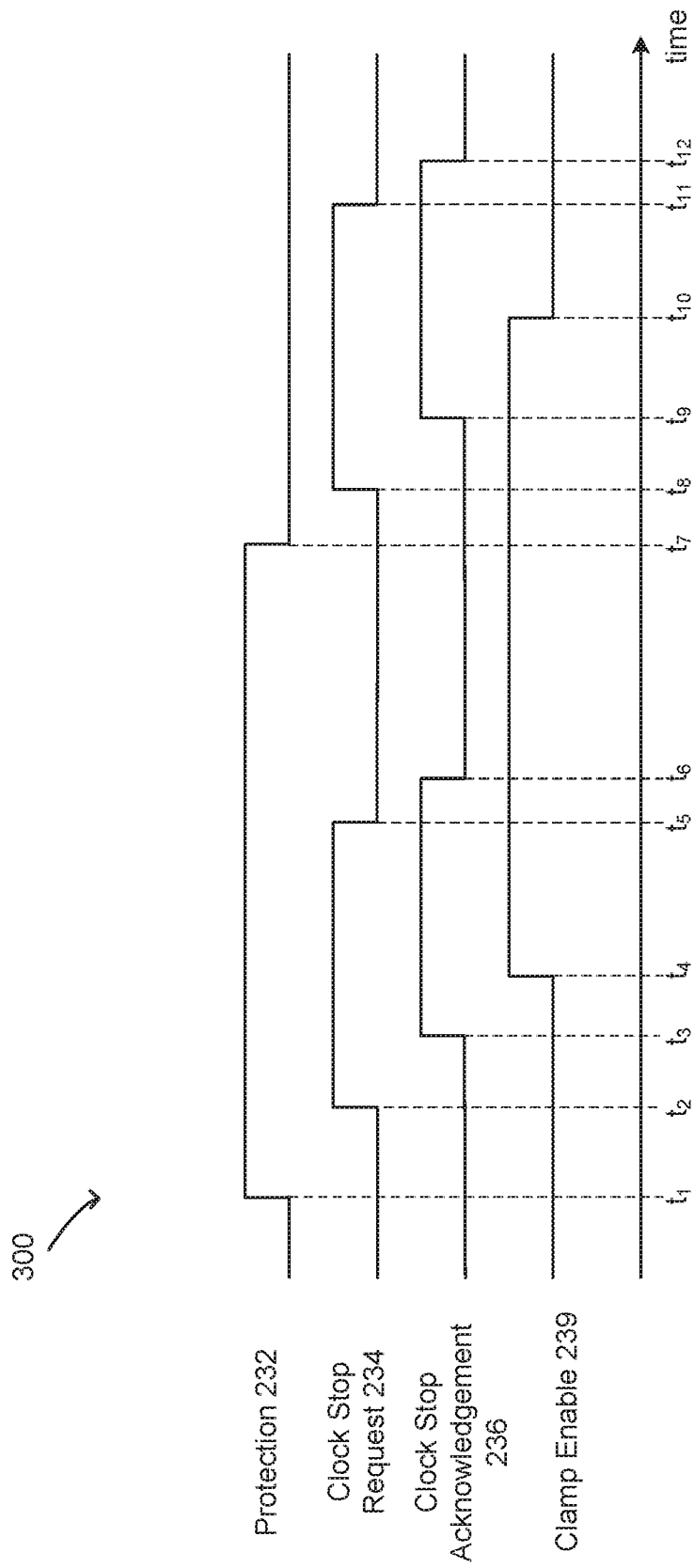
FIG. 3 illustrates an exemplary timing diagram, according to various embodiments.

Protection module 210 includes a control module 212 and a delay unit 214. The features and capabilities of protection module 210 are described in the context of FIG. 3, which illustrates an exemplary timing diagram while protection module 210 is isolating link interface 112, according to various embodiments.

Protection module 210 and control module 212 begin the isolation for link interface 112, when control module 212 receives a protection signal 232 or protection command at time $t_1$. In some embodiments, control module 212 may receive protection signal 232 from test data transfer unit 116 (e.g., in response to test data transfer unit 116 receiving the test start command from test program 242) and/or from test program 242 (e.g., via high-speed data transfer link 130) before test program 242 transmits the test start command to test data transfer unit 116.

At time t2, control module 212 asserts a clock stop request 234 that is transmitted to clock control unit 220. Clock stop request 234 instructs clock control unit 220 to stop transmitting clock signals 222, 224, and/or 226 so that spurious and/or an inconsistent number of clock edges are not received by link interface 112 when link interface 112 is being isolated. Before proceeding further, control module 212 waits for an acknowledgement from clock control unit 220 that the clocks are stopped, which is received at time t3 as a clock stop acknowledgement 236.

Once control module 212 receives clock stop acknowledgement 236, control module 212 asserts a clamp enable 238 at time t4, which is transmitted to a clamp 240 in link interface 112, which causes clamp 240 to isolate link interface 112 from other portions of device 110. Clamp 240 includes various latches, flip-flops, registers, and/or the like that save the current values on the inputs to link interface 112 connected to other portions of device 110 when clamp enable 238 is received by clamp 240. The inputs to link interface 112 are then disconnected from the other portions of device 110 and the saved values are provided to the inputs instead. After transmitting clamp enable 238, control module 212 starts delay unit 214. Delay unit 214 implements a predetermined period of time to allow sufficient time for clamp enable 238 to propagate to each portion of clamp 240 and to allow clamp 240 to isolate link interface 112. After the predetermined period of time expires, delay unit 214 notifies control module 212. In some embodiments, delay unit 214 may be implemented using a delay line, a timer/counter, and/or the like.

In some embodiments, when the configuration information transmitted by test program 242 includes a clock configuration for the test, control module 212 may transmit one or more commands to clock control unit 220 based on the clock configuration. In some embodiments, the clock configuration may be received by control module 212 from test data transfer unit 216 and/or test program 242. In some embodiments, control module 212 may save a previous clock configuration of clock control unit 220 before transmitting the one or more commands to clock control unit 220.

After the delay ends, control module 212 de-asserts clock stop request 234 at time t5. In response to clock stop request 234 being de-asserted, clock control unit 220 starts clock signals 222, 224, and 226 and acknowledges that clock signals 222, 224, and 226 are started by de-asserting clock stop acknowledgement 236 at time t6.

Once clock signals 222, 224, and 226 are started, test data transfer unit 216 may begin the test of device 110 as discussed above by reading the test data from memory 124, transmitting the test data to test bus 118, performing the test by causing the components of device 110 to perform one or more operations to effect at least a part of the test, retrieving the test results from test bus 118, and saving the test results to memory 124.

After the test is complete and test data transfer unit 116 is done using link interface 112 and high-speed data transfer link 130 for testing purposes, control module 212 is notified using protection signal 232 or a stop protection command at time t7. Control module 212 then begins the process of reconnecting link interface 112 to the other portions of device 100 and, if needed, the clock configuration of clock control unit 220.

Control module 212 begins the reconnection process by asserting clock stop request 234 at time $t_8$. Clock control unit 220 responds by stopping clock signals 222, 224, and 226 and acknowledges that clock signals 222, 224, and 226 are stopped by asserting clock stop acknowledgement 236 at time t9. Upon receiving clock stop acknowledgement 236, control module 212 then de-asserts clamp enable 238 at time t9. When clamp 240 receives the de-assertion of clamp enable 238, clamp reconnects the inputs of link interface 112 to the other portions of device 110. Control module 212 then waits a predetermined period of time, such as by using delay unit 214, to allow clamp enable 238 to propagate throughout clamp 240 and to allow clamp 240 to reconnect the inputs of link interface 112 to the other portions of device 110.

In some embodiments, when control module 212 changed the clock configuration of clock control unit 220 for the test, control module 212 transmits one or more commands to clock control unit 220 to restore the configuration of clock control unit 200 to the previous state of clock control unit 200.

After the predetermined period of time ends, control module 212 de-asserts clock stop request 234 at time $t_{11}$. In response to clock stop request 234 being de-asserted, clock control unit 220 starts clock signals 222, 224, and 226 and acknowledges that clock signals 222, 224, and 226 are started by de-asserting clock stop acknowledgement 236 at time $t_{12}$. After time $t_{12}$, the link interface 112 is reconnected to the other portions of device 110 and clock control unit 220 is restored allowing device 110 to resume non-testing tasks.

Advantageously, protection module 210 is able to isolate link interface 112 without having to use the slow serial interface of the IEEE1500 test mechanisms. Additionally, protection module 210 is able to more rapidly isolate link interface 112 than other techniques, because protection module 210 is able to isolate link interface in response to a single protection signal 232, without having to delay while waiting for separate commands to be received from host computer 120, an ATE, or some other device to control each part of the isolation process.

Techniques for Isolating Interfaces during High-Speed Test Data Transfer

Figure 4:
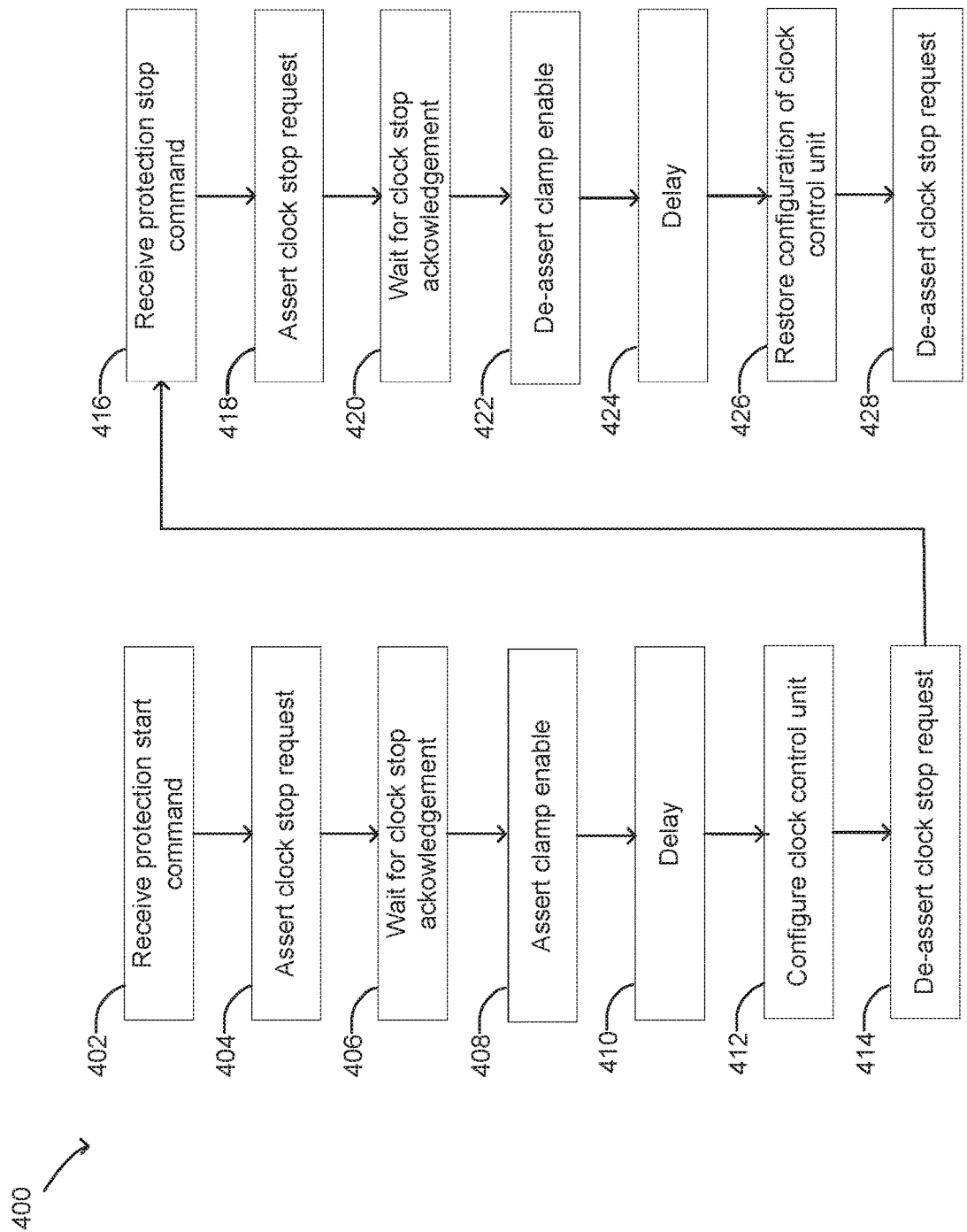
FIG. 4 is a flow chart of method steps for isolating an interface while testing a semiconductor device, according to various embodiments.

FIG. 4 is a flow chart of method steps for isolating an interface during high-speed test data transfer, according to various embodiments. In some embodiments, the method steps of FIG. 4 may be performed by protection module 210 and/or control module 212. Although the method steps are described in conjunction with the systems of FIGS. 1-3, persons skilled in the art will understand that any system configured to perform the method steps in any order falls within the scope of the present disclosure.

As shown in FIG. 4, a method 400 begins at a step 402 where a protection start command is received. In some embodiments, the protection start command may be received at control module 212 of protection module 210 via the assertion of protection signal 232. In some embodiments, the protection start command is received from test data transfer unit 116 and/or from test program 242 running on host computer 120.

At a step 404, control module 212 asserts clock stop request 234. The assertion of clock stop request 234 instructs clock control unit 220 to stop transmitting clock signals 222, 224, and/or 226 so that spurious and/or an inconsistent number of clock edges are not received by link interface 112 while link interface 112 is being isolated.

At a step 406, control module 212 waits for clock control unit 220 to assert clock stop acknowledgement 236. The assertion of clock stop acknowledgement indicates that clock signals 222, 224, and/or 226 being transmitted to link interface 112, link endpoint 114, and/or test data transfer unit 116 are stopped.

At a step 408, control module 212 asserts clamp enable 238. The assertion of clamp enable 238 causes clamp 240 to save the current values on the inputs of link interface 112 connecting link interface 112 to other portions of device 110. The current values can be saved in one or more latches, flip-flops, registers and/or the like in clamp 240. Once the input values are saved, clamp 240 disconnects the inputs of link interface 112 from the other portions of device 110 and instead provides the saved values to the inputs.

At a step 410, control module 212 delays while the assertion of clamp enable 238 propagates to clamp 240 and clamp 240 isolates link interface 112. In some embodiments, control module 212 uses delay unit 214 to implement a predetermined delay.

At an optional step 412, control module 212 configures clock control unit 220. In some embodiments, when the configuration information associated with the test provided by test program 242 includes a clock configuration, control module 212 transmits one or more commands to clock control unit 220 based on the clock configuration. The one or more commands configure a frequency, a phase, and/or the like of clock signals 222, 224, and/or 226 as specified by test program 242 to support the high-speed transfer of test data and/or test results between device 110 and memory 124 using DMA. In some embodiments, control module 212 may optionally save a previous clock configuration of clock control unit 220 before transmitting the one or more commands to clock control unit 220.

At a step 414, control module 212 de-asserts clock stop request 234. The de-assertion of clock stop request 234 instructs clock control unit 220 to start transmitting clock signals 222, 224, and 226. In response, clock control unit 220 starts clock signals 222, 224, and/or 226 allowing test data transfer unit 116 to begin using link interface 112 and high-speed data transfer link 130 to read test data and/or save test results.

At a step 416, control module 212 receives a protection stop command. In some embodiments, the protection stop command may be received via the de-assertion of protection signal 232. In some embodiments, the protection stop command is received from test data transfer unit 116 and/or from test program 242 running on host computer 120.

At a step 418, control module 212 asserts clock stop request 234. The assertion of clock stop request 234 instructs clock control unit 220 to stop transmitting clock signals 222, 224, and/or 226 so that spurious and/or an inconsistent number of clock edges are not received by link interface 112 while link interface 112 is being reconnected to the other portions of device 110.

At a step 420, control module 212 waits for clock control unit 220 to assert clock stop acknowledgement 236. The assertion of clock stop acknowledgement indicates that clock signals 222, 224, and/or 226 being transmitted to link interface 112, link endpoint 114, and/or test data transfer unit 116 are stopped.

At a step 422, control module 212 de-asserts clamp enable 238. The de-assertion of clamp enable 238 causes clamp 240 to reconnect the inputs of link interface 112 to the other portions of device 110.

At a step 424, control module 212 delays while the de-assertion of clamp enable 238 propagates to clamp 240 and clamp 240 reconnects the inputs of link interface 112 to the other portions of device 110. In some embodiments, control module 212 uses delay unit 214 to implement a predetermined delay.

At an optional step 426, control module 212 restores the configuration of clock control unit 220. In some embodiments, when control module 212 saved the previous clock configuration and then configured clock control unit 220 during optional step 412, control module 212 transmits one or more commands to clock control unit 220 to restore the previous clock configuration of clock control unit 220.

At a step 428, control module 212 de-asserts clock stop request 234. The de-assertion of clock stop request 234 instructs clock control unit 220 to start transmitting clock signals 222, 224, and/or 226. In response, clock control unit 220 starts clock signals 222, 224, and/or 226 allowing device 110 and link interface 112 to resume the operation interrupted by the test of device 110 performed by test data transfer unit 116.

As discussed above and further emphasized here, FIGS. 2 and 3 are merely examples which should not unduly limit the scope of the claims. In some embodiments, after the test is complete, at time t7, the inputs of link interface 112 may be reconnected to the other portions of device 110 and/or clock control unit 220 may alternatively be restored by causing device 110 to be reset (e.g., by receiving a reset command from host computer 120) instead of having control module 212 perform steps 416-428. The reset results in the re-initialization of clock control unit 120 by the firmware of device 110 and the de-assertion of clamp enable 238.

Exemplary Hardware Architecture

Figure 5:
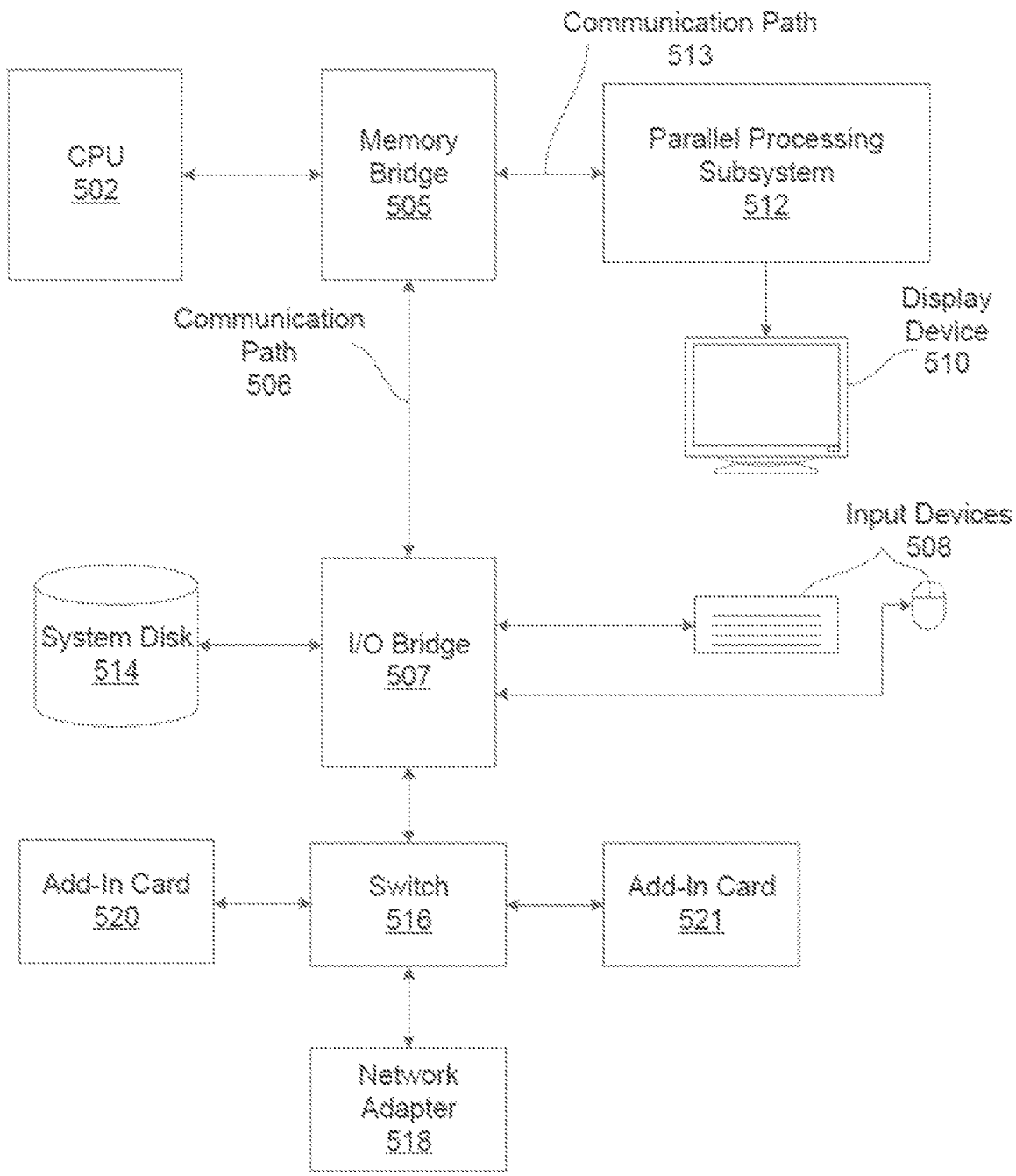
FIG. 5 is a block diagram illustrating a computer system configured to implement one or more aspects of the various embodiments.

FIG. 5 is a block diagram illustrating a computer system 500 configured to implement one or more aspects of the various embodiments. In some embodiments, computer system 500 is a server machine operating in a data center or a cloud computing environment that provides scalable computing resources as a service over a network. In some embodiments, computer system 500 may be representative of all or portions of device 110 and/or host computer 120.

In various embodiments, computer system 500 includes, without limitation, a central processing unit (CPU) 502 and a system memory (not shown) coupled to a parallel processing subsystem 512 via a memory bridge 505 and a communication path 513. Memory bridge 505 is further coupled to an I/O (input/output) bridge 507 via a communication path 506, and I/O bridge 507 is, in turn, coupled to a switch 516.

In one embodiment, I/O bridge 507 is configured to receive user input information from optional input devices 508, such as a keyboard or a mouse, and forward the input information to CPU 502 for processing via communication path 506 and memory bridge 505. In some embodiments, computer system 500 may be a server machine in a cloud computing environment. In such embodiments, computer system 500 may not have input devices 508. Instead, computer system 500 may receive equivalent input information by receiving commands in the form of messages transmitted over a network and received via the network adapter 518. In one embodiment, switch 516 is configured to provide connections between I/O bridge 507 and other components of the computer system 500, such as a network adapter 518 and various add-in cards 520 and 521.

In one embodiment, I/O bridge 507 is coupled to a system disk 514 that may be configured to store content and applications and data for use by CPU 502 and parallel processing subsystem 512. In one embodiment, system disk 514 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high definition DVD), or other magnetic, optical, or solid state storage devices. In various embodiments, other components, such as universal serial bus or other port connections, compact disc drives, digital versatile disc drives, film recording devices, and the like, may be connected to I/O bridge 507 as well.

In various embodiments, memory bridge 505 may be a Northbridge chip, and I/O bridge 507 may be a Southbridge chip. In addition, communication paths 506 and 513, as well as other communication paths within computer system 500, may be implemented using any technically suitable protocols, including, without limitation, AGP (Accelerated Graphics Port), HyperTransport, or any other bus or point-to-point communication protocol known in the art.

In some embodiments, parallel processing subsystem 512 comprises a graphics subsystem that delivers pixels to an optional display device 510 that may be any conventional cathode ray tube, liquid crystal display, light-emitting diode display, or the like. In such embodiments, the parallel processing subsystem 512 incorporates circuitry optimized for graphics and video processing, including, for example, video output circuitry. As described in greater detail below in conjunction with FIGS. 8 and 9, such circuitry may be incorporated across one or more parallel processing units (PPUs), also referred to herein as parallel processors, included within parallel processing subsystem 512. In other embodiments, the parallel processing subsystem 512 incorporates circuitry optimized for general purpose and/or compute processing. Again, such circuitry may be incorporated across one or more PPUs included within parallel processing subsystem 512 that are configured to perform such general purpose and/or compute operations. In yet other embodiments, the one or more PPUs included within parallel processing subsystem 512 may be configured to perform graphics processing, general purpose processing, and compute processing operations. System memory includes at least one device driver configured to manage the processing operations of the one or more PPUs within parallel processing subsystem 512.

In various embodiments, parallel processing subsystem 512 may be integrated with one or more of the other elements of FIG. 5 to form a single system. For example, parallel processing subsystem 512 may be integrated with CPU 502 and other connection circuitry on a single chip to form a system on chip (SoC).

In one embodiment, CPU 502 is the master processor of computer system 500, controlling and coordinating operations of other system components. In one embodiment, CPU 502 issues commands that control the operation of PPUs. In some embodiments, communication path 513 is a PCI Express link, in which dedicated lanes are allocated to each PPU, as is known in the art. Other communication paths may also be used. PPU advantageously implements a highly parallel processing architecture. A PPU may be provided with any amount of local parallel processing memory (PP memory).

It will be appreciated that the system shown herein is illustrative and that variations and modifications are possible. The connection topology, including the number and arrangement of bridges, the number of CPUs 502, and the number of parallel processing subsystems 512, may be modified as desired. For example, in some embodiments, system memory could be connected to CPU 502 directly rather than through memory bridge 505, and other devices would communicate with system memory via memory bridge 505 and CPU 502. In other embodiments, parallel processing subsystem 512 may be connected to I/O bridge 507 or directly to CPU 502, rather than to memory bridge 505. In still other embodiments, I/O bridge 507 and memory bridge 505 may be integrated into a single chip instead of existing as one or more discrete devices. Lastly, in certain embodiments, one or more components shown in FIG. 5 may not be present. For example, switch 516 could be eliminated, and network adapter 518 and add-in cards 520, 521 would connect directly to I/O bridge 507.

Figure 6:
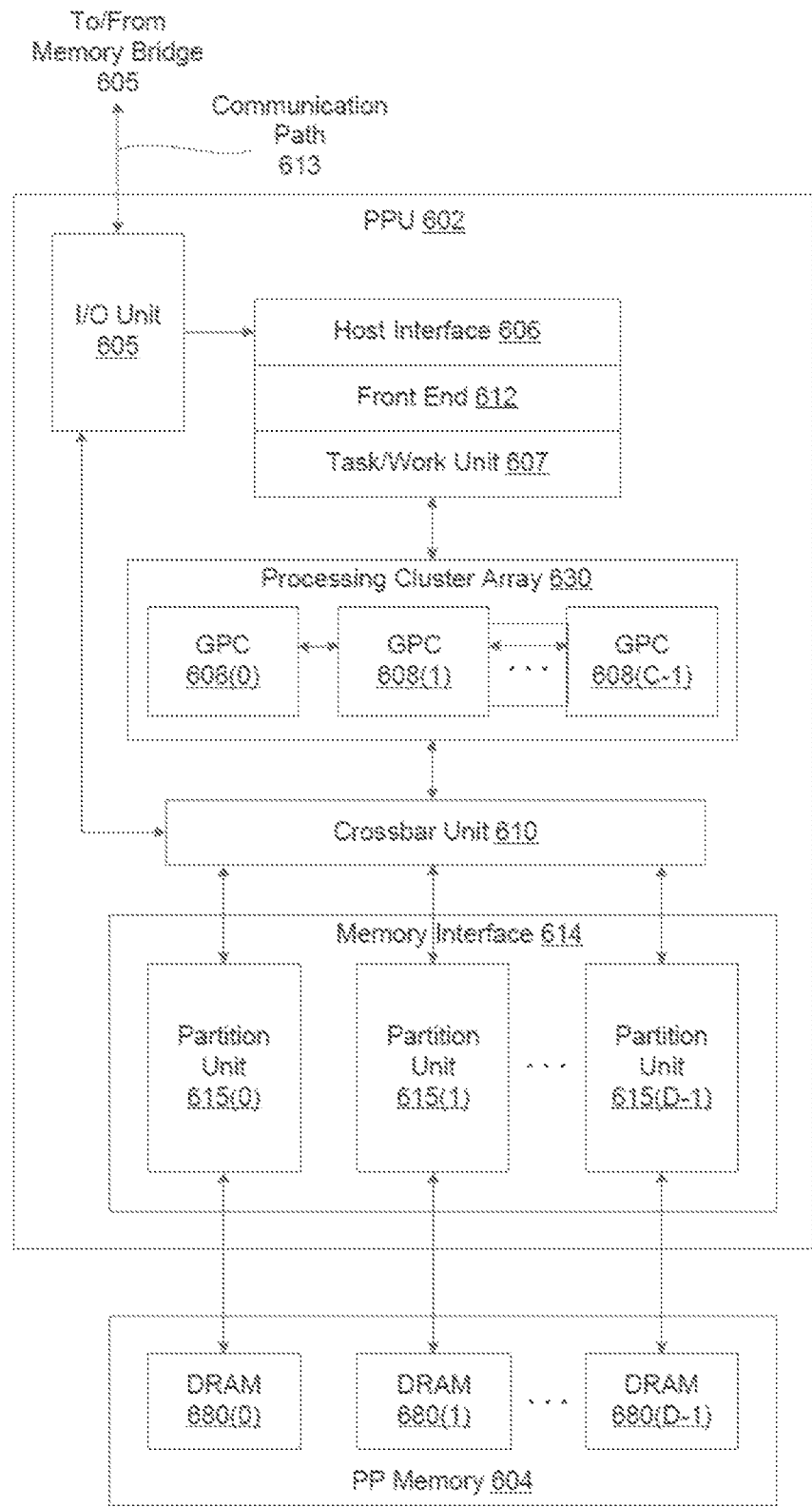
FIG. 6 is a block diagram of a parallel processing unit (PPU) included in the parallel processing subsystem of FIG. 5, according to various embodiments.

FIG. 6 is a block diagram of a parallel processing unit (PPU) 602 included in the parallel processing subsystem 512 of FIG. 5, according to various embodiments. Although FIG. 6 depicts one PPU 602, as indicated above, parallel processing subsystem 512 may include any number of PPUs 602. As shown, PPU 602 is coupled to a local parallel processing (PP) memory 604. PPU 602 and PP memory 604 may be implemented using one or more integrated circuit devices, such as programmable processors, application specific integrated circuits (ASICs), or memory devices, or in any other technically feasible fashion.

In some embodiments, PPU 602 comprises a graphics processing unit (GPU) that may be configured to implement a graphics rendering pipeline to perform various operations related to generating pixel data based on graphics data supplied by CPU 502 and/or system memory. When processing graphics data, PP memory 604 can be used as graphics memory that stores one or more conventional frame buffers and, if needed, one or more other render targets as well. Among other things, PP memory 604 may be used to store and update pixel data and deliver final pixel data or display frames to an optional display device 510 for display. In some embodiments, PPU 602 also may be configured for general-purpose processing and compute operations. In some embodiments, computer system 500 may be a server machine in a cloud computing environment. In such embodiments, computer system 500 may not have a display device 510. Instead, computer system 500 may generate equivalent output information by transmitting commands in the form of messages over a network via the network adapter 518.

In some embodiments, CPU 502 is the master processor of computer system 500, controlling and coordinating operations of other system components. In one embodiment, CPU 502 issues commands that control the operation of PPU 602. In some embodiments, CPU 502 writes a stream of commands for PPU 602 to a data structure (not explicitly shown in either FIG. 5 or FIG. 6) that may be located in system memory, PP memory 604, or another storage location accessible to both CPU 502 and PPU 602. A pointer to the data structure is written to a command queue, also referred to herein as a pushbuffer, to initiate processing of the stream of commands in the data structure. In one embodiment, the PPU 602 reads command streams from the command queue and then executes commands asynchronously relative to the operation of CPU 502. In embodiments where multiple pushbuffers are generated, execution priorities may be specified for each pushbuffer by an application program via device driver to control scheduling of the different pushbuffers.

In one embodiment, PPU 602 includes an I/O (input/output) unit 605 that communicates with the rest of computer system 500 via the communication path 513 and memory bridge 505. In one embodiment, I/O unit 605 generates packets (or other signals) for transmission on communication path 513 and also receives all incoming packets (or other signals) from communication path 513, directing the incoming packets to appropriate components of PPU 602. For example, commands related to processing tasks may be directed to a host interface 606, while commands related to memory operations (e.g., reading from or writing to PP memory 604) may be directed to a crossbar unit 610. In one embodiment, host interface 606 reads each command queue and transmits the command stream stored in the command queue to a front end 612.

As mentioned above in conjunction with FIG. 5, the connection of PPU 602 to the rest of computer system 500 may be varied. In some embodiments, parallel processing subsystem 512, which includes at least one PPU 602, is implemented as an add-in card that can be inserted into an expansion slot of computer system 500. In other embodiments, PPU 602 can be integrated on a single chip with a bus bridge, such as memory bridge 505 or I/O bridge 507. Again, in still other embodiments, some or all of the elements of PPU 602 may be included along with CPU 502 in a single integrated circuit or system of chip (SoC).

In one embodiment, front end 612 transmits processing tasks received from host interface 606 to a work distribution unit (not shown) within task/work unit 607. In one embodiment, the work distribution unit receives pointers to processing tasks that are encoded as task metadata (TMD) and stored in memory. The pointers to TMDs are included in a command stream that is stored as a command queue and received by the front end unit 612 from the host interface 606. Processing tasks that may be encoded as TMDs include indices associated with the data to be processed as well as state parameters and commands that define how the data is to be processed. For example, the state parameters and commands could define the program to be executed on the data. Also for example, the TMD could specify the number and configuration of the set of CTAs. Generally, each TMD corresponds to one task. The task/work unit 607 receives tasks from the front end 612 and ensures that GPCs 608 are configured to a valid state before the processing task specified by each one of the TMDs is initiated. A priority may be specified for each TMD that is used to schedule the execution of the processing task. Processing tasks also may be received from the processing cluster array 630. Optionally, the TMD may include a parameter that controls whether the TMD is added to the head or the tail of a list of processing tasks (or to a list of pointers to the processing tasks), thereby providing another level of control over execution priority.

In one embodiment, PPU 602 implements a highly parallel processing architecture based on a processing cluster array 630 that includes a set of C general processing clusters (GPCs) 608, where C 1. Each GPC 608 is capable of executing a large number (e.g., hundreds or thousands) of threads concurrently, where each thread is an instance of a program. In various applications, different GPCs 608 may be allocated for processing different types of programs or for performing different types of computations. The allocation of GPCs 608 may vary depending on the workload arising for each type of program or computation.

In one embodiment, memory interface 614 includes a set of D of partition units 615, where D 1. Each partition unit 615 is coupled to one or more dynamic random access memories (DRAMs) 620 residing within PPM memory 604. In some embodiments, the number of partition units 615 equals the number of DRAMs 620, and each partition unit 615 is coupled to a different DRAM 620. In other embodiments, the number of partition units 615 may be different than the number of DRAMs 620. Persons of ordinary skill in the art will appreciate that a DRAM 620 may be replaced with any other technically suitable storage device. In operation, various render targets, such as texture maps and frame buffers, may be stored across DRAMs 620, allowing partition units 615 to write portions of each render target in parallel to efficiently use the available bandwidth of PP memory 604.

In one embodiment, a given GPC 608 may process data to be written to any of the DRAMs 620 within PP memory 604. In one embodiment, crossbar unit 610 is configured to route the output of each GPC 608 to the input of any partition unit 615 or to any other GPC 608 for further processing. GPCs 608 communicate with memory interface 614 via crossbar unit 610 to read from or write to various DRAMs 620. In some embodiments, crossbar unit 610 has a connection to I/O unit 605, in addition to a connection to PP memory 604 via memory interface 614, thereby enabling the processing cores within the different GPCs 608 to communicate with system memory or other memory not local to PPU 602. In the embodiment of FIG. 6, crossbar unit 610 is directly connected with I/O unit 605. In various embodiments, crossbar unit 610 may use virtual channels to separate traffic streams between the GPCs 608 and partition units 615.

In one embodiment, GPCs 608 can be programmed to execute processing tasks relating to a wide variety of applications, including, without limitation, linear and nonlinear data transforms, filtering of video and/or audio data, modeling operations (e.g., applying laws of physics to determine position, velocity and other attributes of objects), image rendering operations (e.g., tessellation shader, vertex shader, geometry shader, and/or pixel/fragment shader programs), general compute operations, etc. In operation, PPU 602 is configured to transfer data from system memory and/or PP memory 604 to one or more on-chip memory units, process the data, and write result data back to system memory and/or PP memory 604. The result data may then be accessed by other system components, including CPU 502, another PPU 602 within parallel processing subsystem 512, or another parallel processing subsystem 512 within computer system 500.

In one embodiment, any number of PPUs 602 may be included in a parallel processing subsystem 512. For example, multiple PPUs 602 may be provided on a single add-in card, or multiple add-in cards may be connected to communication path 513, or one or more of PPUs 602 may be integrated into a bridge chip. PPUs 602 in a multi-PPU system may be identical to or different from one another. For example, different PPUs 602 might have different numbers of processing cores and/or different amounts of PP memory 604. In implementations where multiple PPUs 602 are present, those PPUs may be operated in parallel to process data at a higher throughput than is possible with a single PPU 602. Systems incorporating one or more PPUs 602 may be implemented in a variety of configurations and form factors, including, without limitation, desktops, laptops, handheld personal computers or other handheld devices, servers, workstations, game consoles, embedded systems, and the like.

Figure 7:
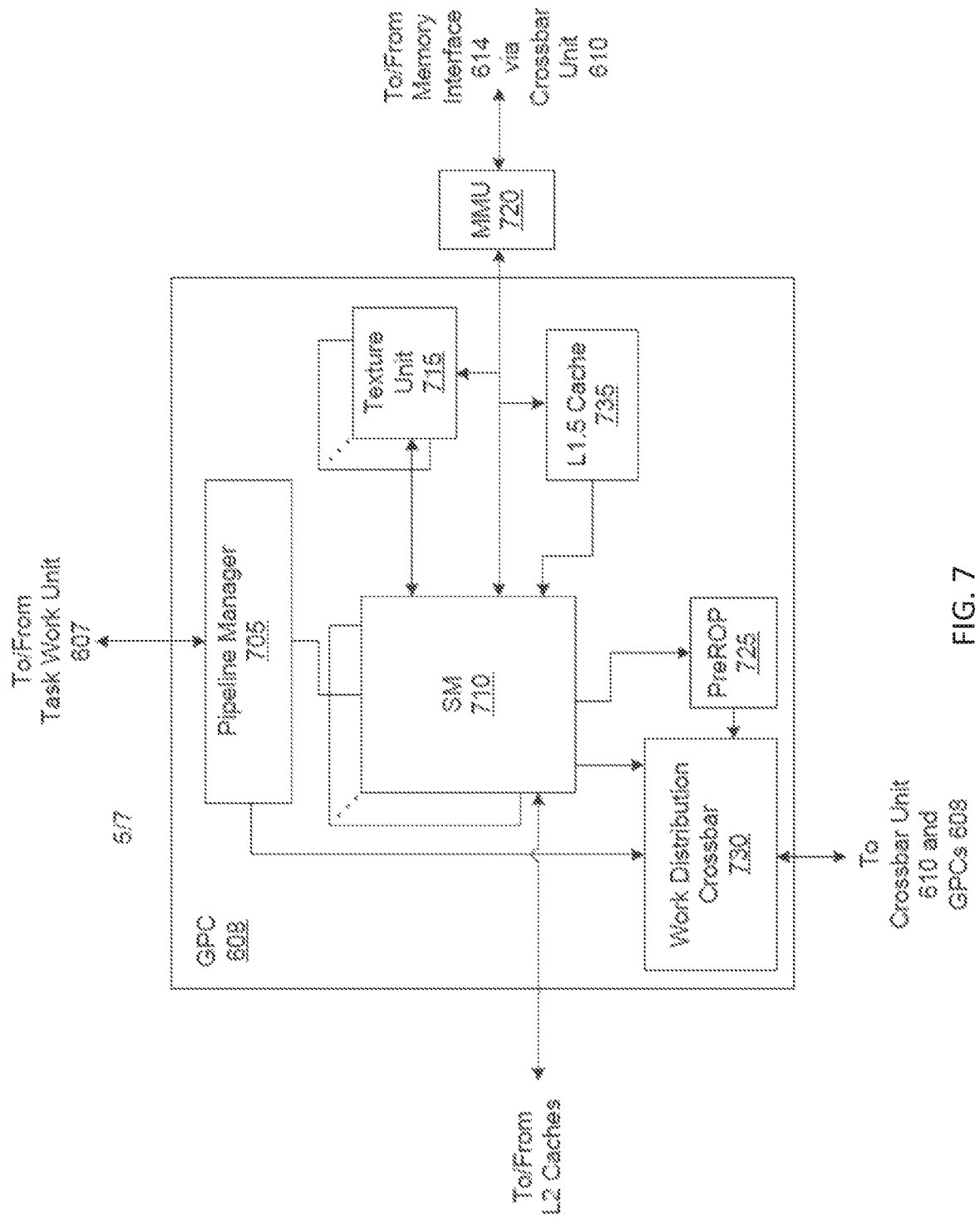
FIG. 7 is a block diagram of a general processing cluster (GPC) included in the parallel processing unit (PPU) of FIG. 6, according to various embodiments.

FIG. 7 is a block diagram of a general processing cluster (GPC) 608 included in the parallel processing unit (PPU) 602 of FIG. 6, according to various embodiments. As shown, the GPC 608 includes, without limitation, a pipeline manager 705, one or more texture units 715, a preROP unit 725, a work distribution crossbar 730, and an L1.5 cache 735.

In one embodiment, GPC 608 may be configured to execute a large number of threads in parallel to perform graphics, general processing and/or compute operations. As used herein, a "thread" refers to an instance of a particular program executing on a particular set of input data. In some embodiments, single-instruction, multiple-data (SIMD) instruction issue techniques are used to support parallel execution of a large number of threads without providing multiple independent instruction units. In other embodiments, single-instruction, multiple-thread (SIMT) techniques are used to support parallel execution of a large number of generally synchronized threads, using a common instruction unit configured to issue instructions to a set of processing engines within GPC 608. Unlike a SIMD execution regime, where all processing engines typically execute identical instructions, SIMT execution allows different threads to more readily follow divergent execution paths through a given program. Persons of ordinary skill in the art will understand that a SIMD processing regime represents a functional subset of a SIMT processing regime.

In one embodiment, operation of GPC 608 is controlled via a pipeline manager 705 that distributes processing tasks received from a work distribution unit (not shown) within task/work unit 607 to one or more streaming multiprocessors (SMs) 710. Pipeline manager 705 may also be configured to control a work distribution crossbar 730 by specifying destinations for processed data output by SMs 710.

In various embodiments, GPC 608 includes a set of M of SMs 710, where M 1. Also, each SM 710 includes a set of functional execution units (not shown), such as execution units and load-store units. Processing operations specific to any of the functional execution units may be pipelined, which enables a new instruction to be issued for execution before a previous instruction has completed execution. Any combination of functional execution units within a given SM 710 may be provided. In various embodiments, the functional execution units may be configured to support a variety of different operations including integer and floating point arithmetic (e.g., addition and multiplication), comparison operations, Boolean operations (AND, OR, 5OR), bit-shifting, and computation of various algebraic functions (e.g., planar interpolation and trigonometric, exponential, and logarithmic functions, etc.). Advantageously, the same functional execution unit can be configured to perform different operations.

In one embodiment, each SM 710 is configured to process one or more thread groups. As used herein, a "thread group" or "warp" refers to a group of threads concurrently executing the same program on different input data, with one thread of the group being assigned to a different execution unit within an SM 710. A thread group may include fewer threads than the number of execution units within the SM 710, in which case some of the execution may be idle during cycles when that thread group is being processed. A thread group may also include more threads than the number of execution units within the SM 710, in which case processing may occur over consecutive clock cycles. Since each SM 710 can support up to G thread groups concurrently, it follows that up to G*M thread groups can be executing in GPC 608 at any given time.

Additionally, in one embodiment, a plurality of related thread groups may be active (in different phases of execution) at the same time within an SM 710. This collection of thread groups is referred to herein as a "cooperative thread array" ("CTA") or "thread array." The size of a particular CTA is equal to m*k, where k is the number of concurrently executing threads in a thread group, which is typically an integer multiple of the number of execution units within the SM 710, and m is the number of thread groups simultaneously active within the SM 710. In some embodiments, a single SM 710 may simultaneously support multiple CTAs, where such CTAs are at the granularity at which work is distributed to the SMs 710.

In one embodiment, each SM 710 contains a level one (L1) cache or uses space in a corresponding L1 cache outside of the SM 710 to support, among other things, load and store operations performed by the execution units. Each SM 710 also has access to level two (L2) caches (not shown) that are shared among all GPCs 608 in PPU 602. The L2 caches may be used to transfer data between threads. Finally, SMs 710 also have access to off-chip "global" memory, which may include PP memory 604 and/or system memory. It is to be understood that any memory external to PPU 602 may be used as global memory. Additionally, as shown in FIG. 7, a level one-point-five (L1.5) cache 735 may be included within GPC 608 and configured to receive and hold data requested from memory via memory interface 614 by SM 710. Such data may include, without limitation, instructions, uniform data, and constant data. In embodiments having multiple SMs 710 within GPC 608, the SMs 710 may beneficially share common instructions and data cached in L1.5 cache 735.

In one embodiment, each GPC 608 may have an associated memory management unit (MMU) 720 that is configured to map virtual addresses into physical addresses. In various embodiments, MMU 720 may reside either within GPC 608 or within the memory interface 614. The MMU 720 includes a set of page table entries (PTEs) used to map a virtual address to a physical address of a tile or memory page and optionally a cache line index. The MMU 720 may include address translation lookaside buffers (TLB) or caches that may reside within SMs 710, within one or more L1 caches, or within GPC 608.

In one embodiment, in graphics and compute applications, GPC 608 may be configured such that each SM 710 is coupled to a texture unit 715 for performing texture mapping operations, such as determining texture sample positions, reading texture data, and filtering texture data.

In one embodiment, each SM 710 transmits a processed task to work distribution crossbar 730 in order to provide the processed task to another GPC 608 for further processing or to store the processed task in an L2 cache (not shown), parallel processing memory 604, or system memory via crossbar unit 610. In addition, a pre-raster operations (preROP) unit 725 is configured to receive data from SM 710, direct data to one or more raster operations (ROP) units within partition units 615, perform optimizations for color blending, organize pixel color data, and perform address translations.

It will be appreciated that the architecture described herein is illustrative and that variations and modifications are possible. Among other things, any number of processing units, such as SMs 710, texture units 715, or preROP units 725, may be included within GPC 608. Further, as described above in conjunction with FIG. 6, PPU 602 may include any number of GPCs 608 that are configured to be functionally similar to one another so that execution behavior does not depend on which GPC 608 receives a particular processing task. Further, each GPC 608 operates independently of the other GPCs 608 in PPU 602 to execute tasks for one or more application programs.

In sum, techniques for isolating interfaces while testing semiconductor devices include a hardware-based protection module located in a semiconductor device being tested. The protection module isolates a link interface for a high-speed data transfer link from other portions of a semiconductor device while the high-speed data transfer unit is used to transfer test data from a host computer to the semiconductor device being tested using DMA and to transfer test results from the semiconductor device being tested to the host computer using DMA. The isolation of the link interface prevents the transfer of the test data and the test results from being corrupted during the testing of the other portions of the semiconductor device. The protection module isolates the link interface by asserting a clock stop request causing a clock control unit of the device to stop transmitting clock signals to the link interface. In response to the clock control unit acknowledging that the clock signals are stopped, the protection module asserts a clamp enable and then delays for a predetermined period time to allow the clamp enable to propagate to a clamp in the link interface and to cause the clamp to save the current values of inputs of the link interface connected to the other portions of the semiconductor device, disconnect the inputs from the other portions of the semiconductor device, and provide the saved values to the inputs. After the delay, the protection module de-asserts the clock stop request allowing the clock control unit to start transmitting the clock signals to the link interface so that the link interface and the high-speed data transfer link can be used transfer the test data and the test results.

The link interface is reconnected to the other portions of the semiconductor device after the transfer of the test data and the test results completes. In some embodiments, causing the semiconductor device to be reset, restores the state of the link interface. In other embodiments, the protection module reconnects the link interface by asserting the clock stop request, waiting for a clock stop acknowledgement from the clock control unit, de-asserting the clamp enable, delaying, and then de-asserting the clock stop request.

One technical advantage of the disclosed techniques relative to the prior art is that, with the disclosed techniques, a hardware-based protection module is implemented to safely isolate a link interface while the link interface is being used during semiconductor device testing. In particular, the protection module is able to control both a clock control unit of the semiconductor device and a clamp located in the link interface during testing, which enables the protection module to stop clock signals from being transmitted to the link interface while the clamp isolates the link interface during a test. Among other things, stopping clock signals from being sent to the link interface during a given test ensures that the link interface does not receive spurious clock events or different numbers of clock events while the clamp isolates the link interface, which, in turn, ensures that the link interface is not corrupted during the test or during the isolating. Another technical advantage is that, with the disclosed techniques, the link interface is isolated faster relative to prior art approaches, thereby reducing overall semiconductor device test time. These technical advantages provide one or more technological improvements over prior art approaches.

1. In some embodiments, a method for testing a semiconductor device comprises causing a clock control unit to stop transmitting clock signals to an interface circuit that couples a semiconductor device to a high-speed data transfer connection; after the clock control unit has stopped transmitting the clock signals, causing the interface circuit to be isolated from portions of the semiconductor device; and after waiting for a first predetermined period of time to expire, causing the clock control unit to start transmitting clock signals again to the interface circuit.

2. The method according to clause 1, wherein, after the clock control unit starts transmitting the clock signals again, the method further comprises: reading test data from memory of a computer via the high-speed data transfer connection; and saving test results to the memory of the computer via the high-speed data transfer connection.

3. The method according to clause 1 or clause 2, wherein, after saving the test results, the method further comprises causing the semiconductor device to be reset.

4. The method according to any of clauses 1-3, wherein, after saving the test results, the method further comprises: causing the clock control unit to stop transmitting clock signals to the interface circuit; after the clock control unit has stopped transmitting the clock signals, causing the interface circuit to be reconnected to the portions of the semiconductor device; and after waiting for a second predetermined period of time to expire, causing the clock control unit to start transmitting clock signals again to the interface circuit.

5. In some embodiments, a semiconductor device comprises: a link interface that couples the semiconductor device to a high-speed data transfer link; a clock control unit that transmits one or more clock signals to the link interface; and a protection module that; asserts a clock stop request to the clock control unit; in response to receiving a clock stop acknowledgement from the clock control unit, asserts a clamp enable to cause the link interface to be isolated from portions of the semiconductor device; and after waiting for a first predetermined period of time to expire, de-asserts the clock stop request.

6. The semiconductor device according to clause 5, wherein the high-speed data transfer link comprises a peripheral component interface express (PCIe) link.

7. The semiconductor device according to clause 5 or clause 6, wherein the protection module comprises a delay unit for implementing the first predetermined period of time.

8. The semiconductor device according to any of clauses 5-7, further comprising: a test data transfer unit, wherein, after the clock stop request is de-asserted, the test data transfer unit: reads test data from a memory of a host computer via the high-speed data transfer link; transmits the test data to a test bus of the semiconductor device; reads test results from the test bus; and saves the test results to the memory via the high-speed data transfer link.

9. The semiconductor device according to any of clauses 5-8, wherein, after the test results have been saved to the memory, the semiconductor device is reset.

10. The semiconductor device according to any of clauses 5-9, wherein, after the test results have been saved to the memory, the protection module further: asserts the clock stop request to the clock control unit; in response to receiving the clock stop acknowledgement from the clock control unit, de-asserts the clamp enable to cause the link interface to be reconnected to the portions of the semiconductor device; and after waiting a second predetermined period of time to expire, de-asserts the clock stop request.

11. The semiconductor device according to any of clauses 5-10, wherein the protection module further transmits one or more commands to the clock control unit to configure the one or more clock signals.

12. The semiconductor device according to any of clauses 5-11, wherein the protection module further saves a configuration of the clock control unit prior to transmitting the one or more commands.

13. The semiconductor device according to any of clauses 5-12, wherein the protection module further restores the configuration of the clock control unit based on the saved configuration.

14. In some embodiments, a method for testing a semiconductor device comprises: asserting a clock stop request to a clock control unit of a semiconductor device, wherein the clock control unit transmits one or more clock signals to a link interface that couples the semiconductor device to a high-speed data transfer link; in response to receiving a clock stop acknowledgement from the clock control unit, asserting a clamp enable to cause the link interface to be isolated from portions of the semiconductor device; and after waiting for a first predetermined period of time to expire, de-asserting the clock stop request.

15. The method according to clause 14, wherein the high-speed data transfer link comprises a peripheral component interface express (PCIe) link.

16. The method according to clause 14 or clause 15, further comprising implementing the first predetermined period of time using a delay unit.

17. The method according to any of clauses 14-16, wherein, after the clock stop request is de-asserted, the method further comprises: reading test data from a memory of a host computer via the high-speed data transfer link; transmitting the test data to a test bus of the semiconductor device; reading test results from the test bus; and saving the test results to the memory via the high-speed data transfer link.

18. The method according to any of clauses 14-17, wherein, after the saving of the test data and the test results, the method further comprises causing the semiconductor device to be reset.

19. The method according to any of clauses 14-18 wherein the test results are saved to the memory, the method further comprises: asserting the clock stop request to the clock control unit; waiting to receive the clock stop acknowledgement from the clock control unit; in response to receiving the clock stop acknowledgement from the clock control unit, de-asserting the clamp enable to cause the link interface to be reconnected to the portions of the semiconductor device; and after waiting for a second predetermined period of time to expire, de-asserting the clock stop request.

20. The method according to any of clauses 14-19, further comprising transmitting one or more commands to the clock control unit to configure the one or more clock signals.

Any and all combinations of any of the claim elements recited in any of the claims and/or any elements described in this application, in any fashion, fall within the contemplated scope of the present embodiments and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module," a "system," or a "computer." In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A method for testing a semiconductor device, comprising:

causing a clock control unit to stop transmitting clock signals to an interface circuit that resides within the semiconductor device and couples the semiconductor device to a high-speed data transfer connection;

after the clock control unit has stopped transmitting the clock signals, causing the interface circuit to be isolated from portions of the semiconductor device; and after waiting for a first predetermined period of time to expire, causing the clock control unit to start transmitting clock signals again to the interface circuit.

2. The method of claim 1, further comprising, in response to causing the clock control unit to start transmitting the clock signals again to the interface circuit:

reading test data from memory of a computer via the high-speed data transfer connection;

causing the semiconductor device to perform one or more tests to generate test results based on the test data; and saving the test results to the memory of the computer via the high-speed data transfer connection.

3. The method of claim 2, wherein, after saving the test results, the method further comprises causing the semiconductor device to be reset.

4. The method of claim 2, wherein, after saving the test results, the method further comprises:

causing the clock control unit to stop transmitting clock signals to the interface circuit;

after the clock control unit has stopped transmitting the clock signals, causing the interface circuit to be reconnected to the portions of the semiconductor device; and after waiting for a second predetermined period of time to expire, causing the clock control unit to start transmitting clock signals again to the interface circuit.

5. A semiconductor device, comprising:

a link interface that resides within the semiconductor device and couples the semiconductor device to a high-speed data transfer link;

a clock control unit that transmits one or more clock signals to the link interface; and a protection module that:

asserts a clock stop request to the clock control unit;

in response to receiving a clock stop acknowledgement from the clock control unit, asserts a clamp enable to cause the link interface to be isolated from portions of the semiconductor device; and after waiting for a first predetermined period of time to expire, de-asserts the clock stop request.

6. The semiconductor device of claim 5, wherein the high-speed data transfer link comprises a peripheral component interface express (PCIe) link.

7. The semiconductor device of claim 5, wherein the protection module comprises a delay unit for implementing the first predetermined period of time.

8. The semiconductor device of claim 5, further comprising:

a test data transfer unit, wherein, in response to the clock stop request being de-asserted, the test data transfer unit:

reads test data from a memory of a host computer via the high-speed data transfer link;

transmits the test data to a test bus of the semiconductor device to cause the semiconductor device to perform one or more tests to generate test results based on the test data;

reads the test results from the test bus; and saves the test results to the memory via the high-speed data transfer link.

9. The semiconductor device of claim 8, wherein, after the test results have been saved to the memory, the semiconductor device is reset.

10. The semiconductor device of claim 8, wherein, after the test results have been saved to the memory, the protection module further:

asserts the clock stop request to the clock control unit;

in response to receiving the clock stop acknowledgement from the clock control unit, de-asserts the clamp enable to cause the link interface to be reconnected to the portions of the semiconductor device; and after waiting a second predetermined period of time to expire, de-asserts the clock stop request.

11. The semiconductor device of claim 5, wherein the protection module further transmits one or more commands to the clock control unit to configure the one or more clock signals.

12. The semiconductor device of claim 11, wherein the protection module further saves a configuration of the clock control unit prior to transmitting the one or more commands.

13. The semiconductor device of claim 12, wherein the protection module further restores the configuration of the clock control unit based on the saved configuration.

14. A method for testing a semiconductor device, comprising:

asserting a clock stop request to a clock control unit of the semiconductor device, wherein the clock control unit transmits one or more clock signals to a link interface that resides within the semiconductor device and couples the semiconductor device to a high-speed data transfer link;

in response to receiving a clock stop acknowledgement from the clock control unit, asserting a clamp enable to cause the link interface to be isolated from portions of the semiconductor device; and after waiting for a first predetermined period of time to expire, de-asserting the clock stop request.

15. The method of claim 14, wherein the high-speed data transfer link comprises a peripheral component interface express (PCIe) link.

16. The method of claim 14, further comprising implementing the first predetermined period of time using a delay unit.

17. The method of claim 14, further comprising, in response to causing the clock stop request being de-asserted, the method further comprises:

reading test data from a memory of a host computer via the high-speed data transfer link;

transmitting the test data to a test bus of the semiconductor device to cause the semiconductor device to perform one or more tests to generate test results based on the test data;

reading the test results from the test bus; and saving the test results to the memory via the high-speed data transfer link.

18. The method of claim 17, wherein, after the saving of the test data and the test results, the method further comprises causing the semiconductor device to be reset.

19. The method of claim 17 wherein the test results are saved to the memory, the method further comprises:

asserting the clock stop request to the clock control unit;

waiting to receive the clock stop acknowledgement from the clock control unit;

in response to receiving the clock stop acknowledgement from the clock control unit, de-asserting the clamp enable to cause the link interface to be reconnected to the portions of the semiconductor device; and after waiting for a second predetermined period of time to expire, de-asserting the clock stop request.

20. The method of claim 14, further comprising transmitting one or more commands to the clock control unit to configure the one or more clock signals.

* * * * *